(12) United States Patent
Asai et al.

(10) Patent No.: US 6,831,234 B1
(45) Date of Patent: Dec. 14, 2004

(54) MULTILAYER PRINTED CIRCUIT BOARD

(75) Inventors: Motoo Asai, Gifu (JP); Yoichiro Kawamura, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 1191 days.

(21) Appl. No.: 08/871,890

(22) Filed: Jun. 9, 1997

(30) Foreign Application Priority Data

Jun. 19, 1996 (JP) .............................. 8-158507

(51) Int. Cl.$^7$ ........................... H01R 12/04; H05K 1/11
(52) U.S. Cl. ...................... 174/261; 174/235; 361/777; 257/778
(58) Field of Search ................... 174/254, 255, 174/260, 261, 263; 361/777, 779, 795, 792; 257/738, 778, 780; 438/612, 613, FOR 369

(56) References Cited

U.S. PATENT DOCUMENTS

| | | | |
|---|---|---|---|
| 4,866,507 A | * 9/1989 | Jacobs et al. | ............... 174/258 |
| 5,248,852 A | * 9/1993 | Kumagi | .................. 174/260 X |
| 5,355,019 A | 10/1994 | Fuchs | |
| 5,433,822 A | 7/1995 | Mimura et al. | |
| 5,442,134 A | 8/1995 | Miyazaki et al. | |
| 5,473,120 A | * 12/1995 | Ito et al. | ................. 174/255 X |
| 5,487,218 A | 1/1996 | Bhatt et al. | |
| 5,557,844 A | 9/1996 | Bhatt et al. | |
| 5,646,828 A | * 7/1997 | Degani et al. | .......... 257/738 X |
| 5,724,232 A | * 3/1998 | Bhatt et al. | ............. 174/255 X |

FOREIGN PATENT DOCUMENTS

| | | |
|---|---|---|
| DE | 4327950 | 3/1994 |
| EP | 0536418 | 4/1993 |
| EP | 0559384 | 9/1993 |
| EP | 0713359 | 5/1996 |

(List continued on next page.)

OTHER PUBLICATIONS

An English Language Abstract of JP No. 4–337695.
An English Language Abstract of JP No. 7–94855.
An English Language Abstract of JP No. 6–69615.
An English Language Abstract of JP No. 6–53640.
An English Language Abstract of JP No. 6–350230.
An English Language Abstract of JP No. 6–204655.
An English Language Abstract of JP No. 3–11792.

*Primary Examiner*—Kamand Cuneo
*Assistant Examiner*—Jeremy Norris
(74) *Attorney, Agent, or Firm*—Greenblum & Bernstein, P.L.C.

(57) ABSTRACT

Multilayer printed circuit board includes a core substrate and multilayer wiring layers formed on the core substrate by alternately laminating interlaminar insulating layer and conductor circuit. The multilayer printed circuit board further includes a group of solder pads having solder bumps planarly arranged on an outermost surface of the multilayer wiring layers. Solder pads located in at least one and up to five rows from an outer position of the solder pad group have flat pads connected to a conductor pattern located on the outermost surface and have solder bumps formed on surfaces of the solder pads, while solder pads other than the solder pads connected to the conductor pattern on the outermost surface form an inner layer pad group. Solder pads of the inner layer pad group are connected to viaholes connected to flat inner layer pads located on one of a first inner layer and at least one further inner layer with solder bumps being formed in recess portions of the viaholes, the inner layer pad group comprising solder pads located in at least one and up to five rows from an outer position of the inner layer pad group that are connected through the viaholes to flat pads connected to conductor patterns on the first inner layer, while solder pads of the inner layer pad group other than the solder pads connected to flat pads connected to conductor patterns on the first inner layer are connected through the viaholes to flat pads located on the at least one further inner layer located inward relative to the first inner layer.

20 Claims, 6 Drawing Sheets

FOREIGN PATENT DOCUMENTS

| | | | |
|---|---|---|---|
| JP | 402100353 A * | 4/1990 | |
| JP | 3-11792 | 1/1991 | |
| JP | 4-337695 | 11/1992 | |
| JP | 6-53640 | 2/1994 | |
| JP | 6-69615 | 3/1994 | |
| JP | 6204655 | 7/1994 | |
| JP | 6350230 | 12/1994 | |
| JP | 7-94855 | 4/1995 | |
| JP | 7-106767 * | 4/1995 | |
| JP | 7106767 | 4/1995 | |
| WO | 96/39796 | 12/1996 | |

\* cited by examiner

MULTILAYER PRINTED CIRCUIT BOARD

BACKGROUND OF THE INVENTION

1. Field of the Invention

This invention relates to a multilayer printed circuit board, and more particularly to a multilayer printed circuit board for mounting of flip chip capable of mounting in a high density and being less in the distortion through curing shrinkage of resin and the position shifting of solder and having an excellent mounting reliability.

2. Description of Related Art

In general, the multilayer printed circuit board for the mounting of flip chip (for example, package) is provided at its mounting surface with a group of solder pads having solder bumps planarly arranged.

The solder pad has a structure that solder having a spherical shape through surface tension is formed on a surface of a flat and disc-shaped conductor as a mounting pad (or land) connected to a given conductor pattern of the wiring substrate, which are electrically connected to external terminals for mounting a package on a mother board or the like through given wirings drawn out from the mounting pad.

In such a structure of the solder pad group, however, it is required to electrically connect a conductor pattern connected to a mounting pad constituting the solder pad located in the inside of the solder pad group to the external terminal through a wiring drawn out from the pad while being detoured from a mounting pad located in the outside of the solder pad group. Therefore, it is necessary to ensure a zone corresponding to a width of the wiring in a gap between pads located in the vicinity of an outer periphery of the wiring substrate, so that there is caused a problem that it is difficult to conduct high integration of electron components (chips).

If it is intended to produce the multilayer print circuit board by so-called build-up method, a portion of locally crowding pads of a metal is formed on the surface of the wiring substrate. Therefore, there is caused a problem that displacement or strain is caused on the substrate surface due to the curing shrinkage of the resin or the difference of thermal expansion coefficient, or cracks resulted therefrom are caused. If such a displacement or strain is existent on the surface of the wiring substrate, the sure surface mounting of the chip onto the substrate can not be carried out, or further if the cracks are created on the wiring substrate, the conductor pattern is broken.

SUMMARY OF THE INVENTION

It is, therefore, an object of the invention to solve the aforementioned problems of the conventional technique and to propose a novel construction of solder pad group in a multilayer printed circuit board for mounting of flip chip advantageous for the high integration of chips and having excellent mounting reliability without causing displacement or strain of substrate surface or cracks resulted therefrom.

The inventors have made various studies in order to achieve the above object and as a result the invention has been accomplished.

According to the invention, there is the provision of a multilayer printed circuit board comprising a core substrate, multilayer wiring layers formed on the substrate by alternately laminating an interlaminar insulating layer and conductor circuit and a group of solder pads having solder bumps planarly arranged on an outermost surface of the multilayer wiring layers, characterized in that (1) the solder pads located from at least one and up to five rows from an outer position of the solder pad group an outer layer pad group are constructed with flat pads connected to conductor pattern located on the outermost surface and solder bumps formed on the surfaces of the pads, while the solder pad group other than these solder pads are constructed with viaholes connected to flat innerlayer pad group located in an inner layer and solder bumps formed in recess portions of the viaholes, and (2) the solder pads located from at least one and up to five rows from an outer position of the innerlayer pad group are constructed with flat pads connected to conductor patterns in the same layer as the innerlayer pad group, while the innerlayer pad groups other than the pads are constituted with flat pads connected to a further innerlayer flat pad group located inward the above innerlayer through viaholes, and (3) the layer having the structure of the above item (2) is at least one layer.

Figure 1:
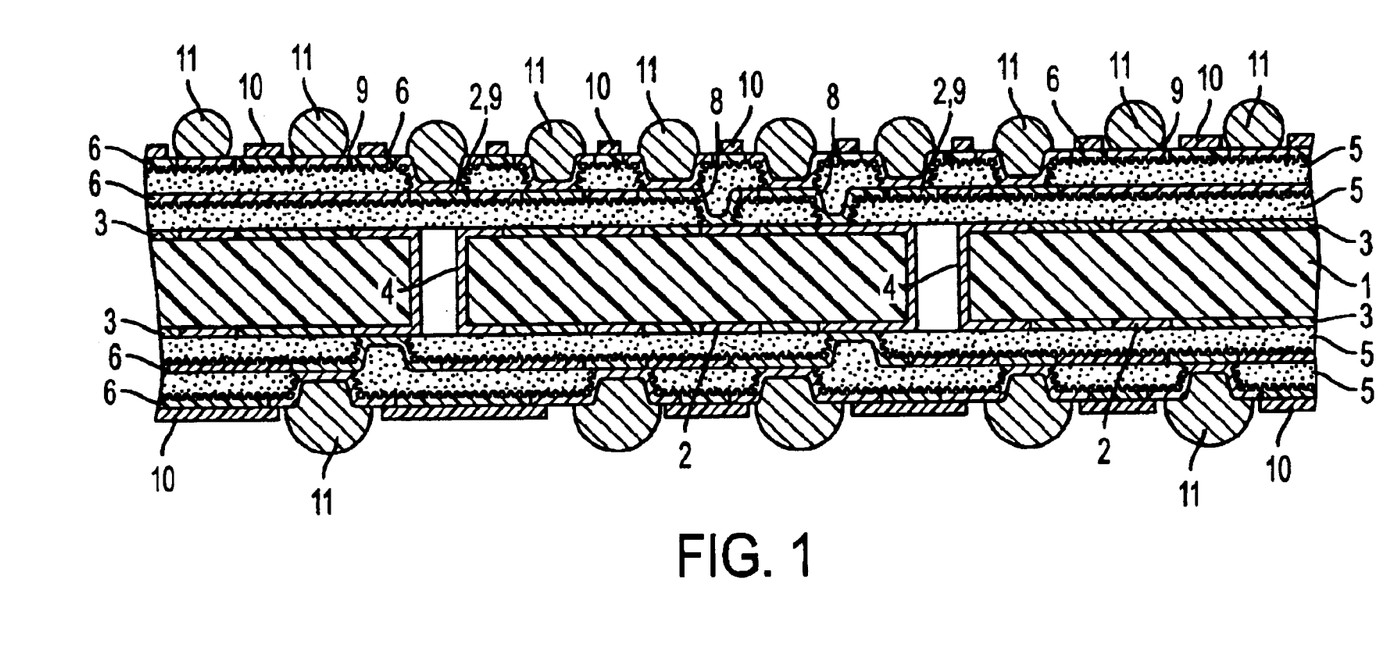
FIG. 1 is a diagrammatically section view of an embodiment of the multilayer printed circuit board according to the intention.

A typical structure of the above multilayer printed circuit board is shown in FIG. 1.

Thus, the invention proposes a novel construction of solder pad groups in the multilayer printed circuit board for mounting flip chip in which the solder pad group having pads planarly arranged with solder bumps is formed on the outermost surface of the multilayer wiring layers formed on the core substrate by alternately laminating the interlaminar insulating layer and the conductor circuit.

Figure 2:
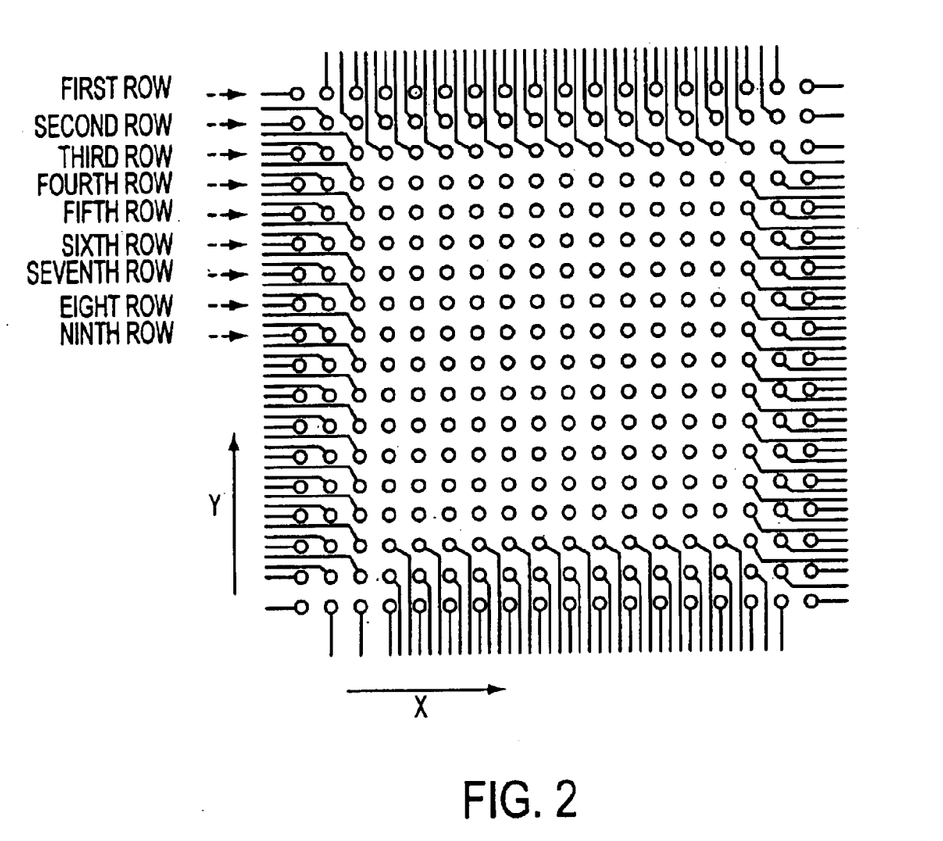
FIG. 2 is a diagrammatic view illustrating a first embodiment of the arrangement of solder bumps (cell state)
Figure 3A:
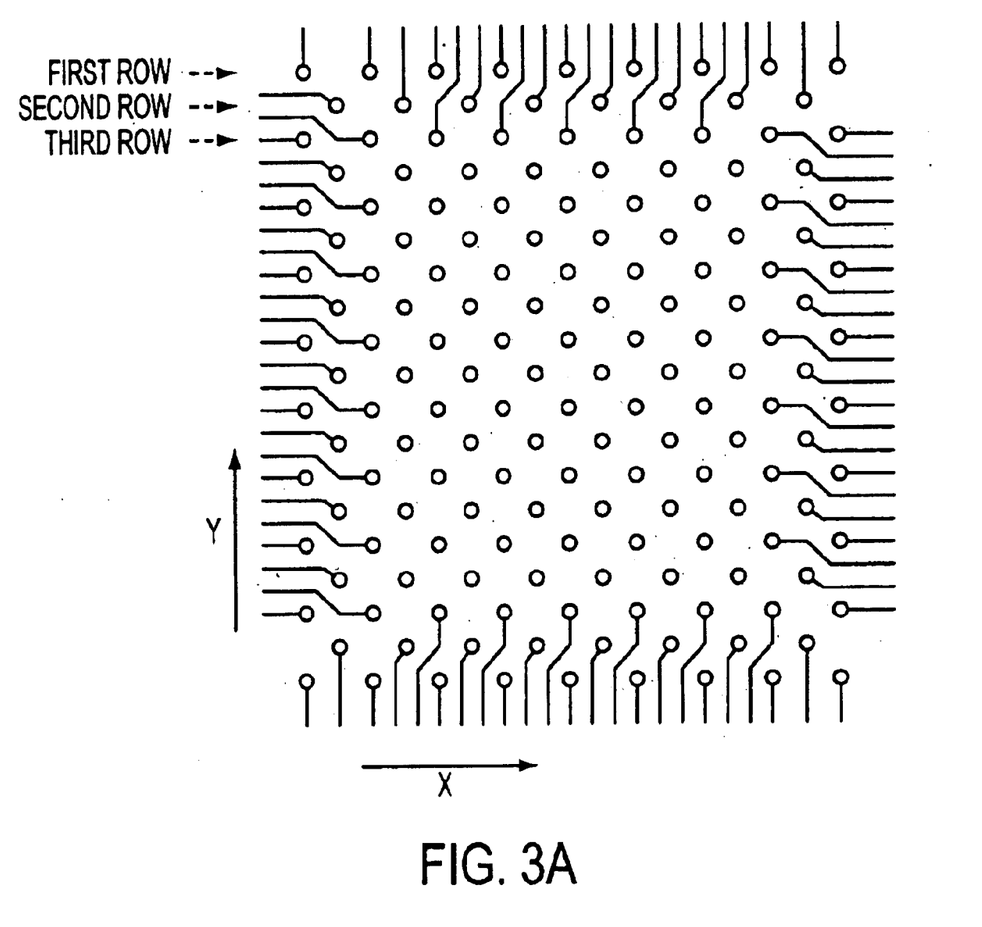
FIG. 3(a) is a diagrammatic view illustrating a second embodiment the arrangement of solder bumps (zigzag arrangement) and FIG. 3(b) is a partly enlarged view thereof.
Figure 3B:
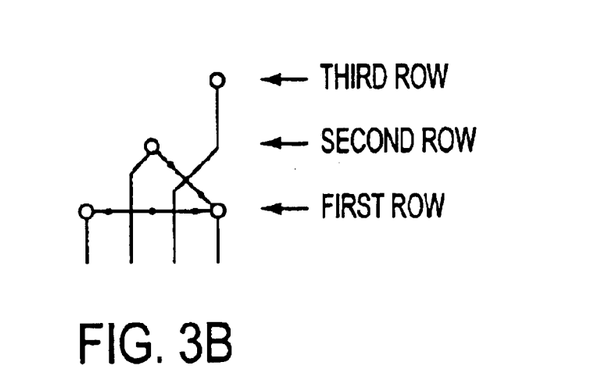

The term "planarly arranged" used herein means not only a method of arranging pads at cell state in X-Y axial directions as shown in FIG. 2 but also a method of arranging pads at zigzag state every one in X-Y axial directions as shown in FIG. 3. Particularly, the zigzag arranged form is advantageous in a point that the wiring is easily drawn out from pads of the second to fifth rows from an outer position of pad group toward external terminals.

BRIEF DESCRIPTION OF THE DRAWINGS

The invention will be described with reference to the accompanying drawings, wherein.

DESCRIPTION OF REFERENCE SYMBOLS

1 Substrate (core)
2 Copper pattern

3 Insulating resin
4 Through-hole
5 Interlaminar insulating layer
6 Plating resist
8 Viahole
9 Flat pad
10 Solder resist
11 Solder pad

DESCRIPTION OF PREFERRED EMBODIMENTS

In the multilayer printed circuit board according to the invention, the solder pads located from at least one and up to five rows from the outside of solder pad groups located on the outermost surface of the multilayer wiring layers are constructed with flat pads connected to conductor patterns on the outermost surface and solder bumps formed on the surfaces of these pads, while the solder pad group other than these solder pads is constructed with viaholes connected to innerlayer flat pad group located inside the above pad group and solder bumps formed in recess portions of the viaholes.

According to the above construction, pads in the solder pads located from the at least one and up to five rows from the outside of the solder pad group (e.g. pads of first, second and third rows in FIG. 2) are connected to the conductor patterns on the outermost surface, which are electrically connected to external terminals through wirings drawn out from these pads. At the same time, the pads (e.g. pads of fourth, fifth, sixth, seventh, eighth and ninth rows in FIG. 2) other than the above solder pads located from the at least one and up to five rows are connected to innerlayer flat pad group located in the innerlayer through viaholes, which are electrically connected to external terminals through wirings drawn out from these innerlayer pads. That is, the conductor patterns connected to the pads located from the at least one and up to five rows from the outside are connected to the external terminals through the wirings drawn out from the pads while being detoured from the pads of the at least one and up to five rows, while the pads other than the above pads are constructed with the viaholes and connected to the innerlayer pads, which are connected to the external terminals through the wirings drawn out from these innerlayer pads.

In the invention, therefore, the wirings for the connection to the external terminals are sequentially drawn out from the respective innerlayer pads instead of the conventional structure that all wirings are drawn out from the solder pad group on the outermost surface, so that it is sufficient to ensure a region capable of passing four wirings at most as the distance between the pads and it is possible to attain the high densification of the solder pads.

In the multilayer printed circuit board according to the invention, the solder pad group other than the solder pads located from the at least one and up to five rows are constructed with the viaholes connected to the flat innerlayer pad group located in the innerlayer and the solder bumps formed in the recess portions of the viaholes.

Therefore, the multilayer printed circuit board according to the invention has a structure that a metal column is embedded in the interlaminar insulating layer, so that the deformation of resin through curing shrinkage is small as compared with the conventional structure of merely arranging the flat pads on the outermost surface. As a result, there is caused no distortion or warping of the substrate in the multilayer printed circuit board according to the invention.

Furthermore, according to the above structure of the solder pads, the amount of solder can be increased and hence the accurate mounting is enabled by a self-alignment effect resulted from surface tension.

The viahole according to the invention has a structure that an opening is formed in the interlaminar insulating layer so as to expose the innerlayer pad and coated with a metal film for electrically connecting the innerlayer pad to a conductor circuit on the surface of the interlaminar insulating layer. The solder pad according to the invention is formed by filling solder in the recess portion of the viahole. Therefore, the invention is not a technique of electrically connecting the innerlayer pad to the conductor circuit on the surface of the interlaminar insulating layer through the solder as disclosed in JP-A-4-337695. When the solder is directly contacted with the insulating resin layer as disclosed in JP-A-4-337695, the degradation of resin is caused due to diffusion of lead. Furthermore, the wetting between resin and solder is poor, so that there is caused a drawback that the viahole constituted with the solder is easily fallen down. In the invention, the viahole is made from the metal film and the solder is filled in the recess portion of the viahole, so that there is no degradation of resin nor falling of viahole.

In the multilayer printed circuit board according to the invention, only the pads constituting the solder pads located from the at least one and up to five rows in the solder pad group are not viaholes but are flat pads. Thus, these flat pads are rendered into a buffer region, whereby the occurrence of cracks due to the difference of curing shrinkage or thermal expansion coefficient between the region of viaholes and region of interlaminar insulating layer can be controlled.

Another feature of the multilayer printed circuit board according to the invention lies in that the pad group located from the at least one and up to five rows the innerlayer pad group connected to the viaholes are constructed with the flat pads connected to conductor patterns in the same layer as the innerlayer pads, and the innerlayer pad groups other than these pads are constructed with the flat pads connected to the flat innerlayer pad group located in the innerlayer through viaholes.

The multilayer printed circuit board according to the invention having such a layer structure has at least one innerlayer, in which the solder pads located at an innermost side in the solder pad group located on the outermost surface of the multilayer printed wiring layer are connected to the innerlayer pads on the core substrate.

Thus, it is possible to attain the high densification of the innerlayer pads even in the innerlayer pad group likewise the above case.

Further, only the innerlayer pads located from the at least one and up to five rows in the innerlayer pad group are flat pads not connected to the viaholes. As a result, these flat pads are rendered into a buffer region, whereby the occurrence of cracks due to the difference of curing shrinkage or thermal expansion coefficient between the region of viaholes and region of interlaminar insulating layer can be controlled.

As mentioned above, the solder pad group located on the outermost surface provided with the viaholes having the solder bumps therein is connected to the innerlayer pad group located in the underlayer through the viaholes, and the pads other than the pads located from the at least one and up to five rows are successively connected to the innerlayer pads further located below the layer through the viaholes, and finally connected to the innerlayer pads on the substrate. Furthermore, the conductor patterns connected to the pad groups are divided into each of the innerlayer pad groups and drawn out from pads of the at least one and up to five rows from an outer position of the innerlayer pad group and connected to external terminals. As a result, the solder pad group located on the outermost surface of the multilayer wiring layer is sufficient to ensure a region capable of passing four wirings at most as the distance between the pads located from at least one and up to five rows from the outer periphery of the solder pad group and it is possible to attain the high densification of the solder pads.

Moreover, the conductor patterns of the multilayer wiring layer connected to the pad group are connected to external terminals such as solder bumps or conductor pins formed on a rear surface of the core substrate through the through-holes. Particularly, it is favorable that multilayer wiring layers formed by alternately laminating conductor layer electrically connected to the through-hole and the resin insulating layer are arranged on the rear surface of the core substrate and solder bumps are formed on the surface (see FIG. 1).

In the multilayer printed circuit board according to the invention, the viaholes constituting the solder pad group are apt to be peeled because they are connected to only the innerlayer pads. In order to prevent the peeling of the viahole, therefore, it is desirable that the surface of the interlaminar insulating layer forms a roughened surface having a surface roughness of 5–15 μm. When the surface roughness is less than 5 μm, the adhesion strength to the viahole is insufficient, while when it exceeds 15 μm, it is difficult to obtain a fine conductor pattern.

In the invention, it is advantageous that the solder resist layer is formed on the outermost surface of the multilayer wiring layer and the opening size of the solder resist is made larger than the diameter of the flat pad and viahole constituting the solder pad so as not to overlap the solder resist with the pad and the viahole.

In the structure of high densified solder pads as in the invention, if the opening size of the solder resist is made smaller than the diameter of the pad, when the solder resist made from the photosensitive resin is opened by light exposure phenomenon (so-called photolithography), the position shifting of the opening is caused by expansion or shrinkage of a photomask through temperature to substantially decrease the exposed area of the pad. As a result, when solder is formed on the opening portion, it is apt to cause defects such as solder flowing, solder bridge and the like and hence the mounting reliability of components is poor.

Therefore, it is desirable that the opening size of the solder resist according to the invention is made larger than the diameter of the pad or the viahole.

Figure 4A:
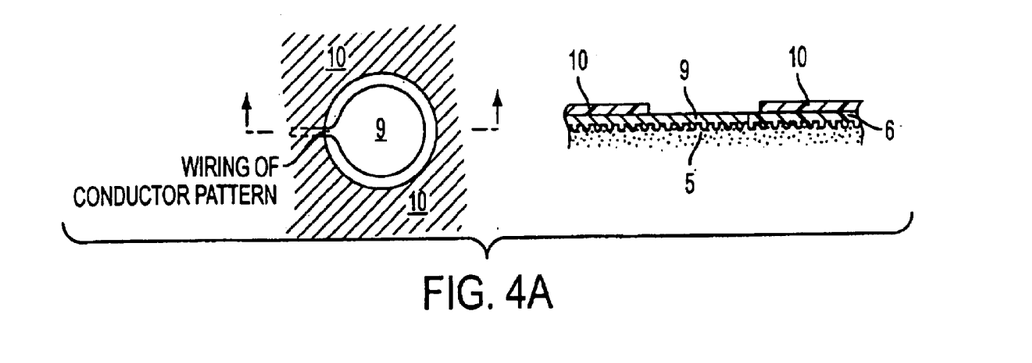
FIG. 4(a) is a view illustrating an opening state of solder resist in a flat pad and FIG. 4(b) is view illustrating a position displacement of solder bump in a flat pad.
Figure 4B:
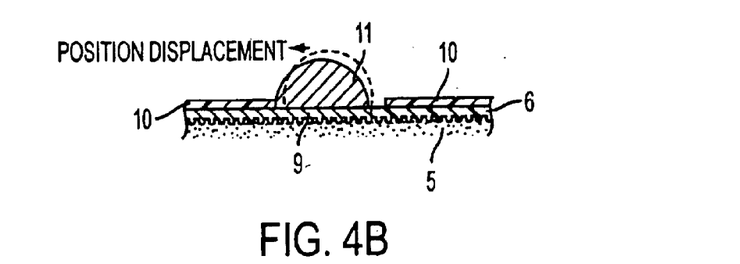

On the contrary, in the conventional technique that all solder pads located on the outermost surface of the multilayer wiring layer are flat pads, all of these flat pads are connected to the conductor patterns at the same layer existing these pads. Therefore, if the opening size of the solder resist is made larger than the diameter of the pad, a part of the wiring in the conductor pattern is apt to be exposed (see FIG. 4(a)). As a result, when the solder is formed on this portion, the solder rides on the wiring of the exposed conductor pattern to lower the solder bump and the position shifting of the solder bump is caused (see FIG. 4(b)).

Figure 5A:
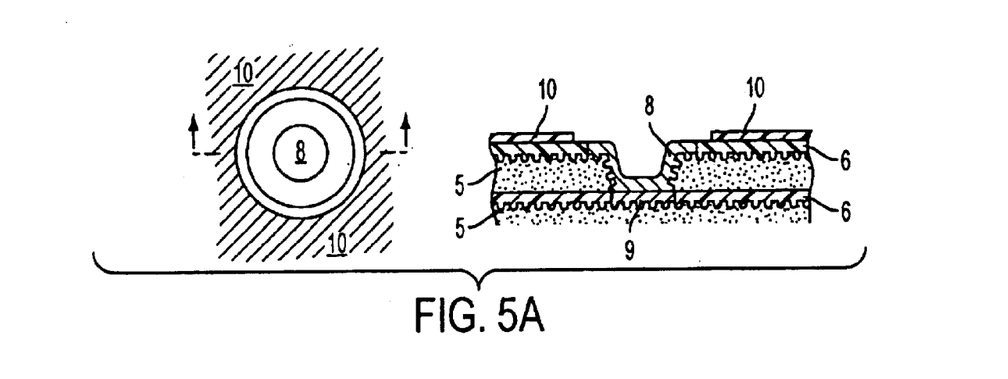
FIG. 5(a) is a view illustrating an opening state of solder resist in a viahole and FIG. 5(b) is view illustrating a position displacement of solder bump in the viahole.
Figure 5B:
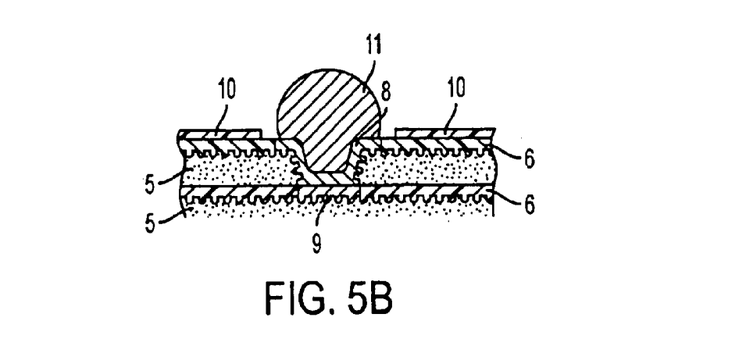

In this point, according to the invention, the solder pad group other than solder pads located from the at least one and up to five rows in the pad group is constituted with the solder pads formed in the recess portions of the viaholes, so that they are not connected to the conductor patterns located at the same layer. Furthermore, the pads for the formation of solder bump are not newly connected from the viaholes in the invention, so that even if the opening portion of the solder resist is made larger than the diameter of the viahole, there is not exposed the wiring of the conductor pattern from the opening portion of the solder resist (see FIG. 5(a)). Therefore, according to the structure that the solder bump is formed in the recess portion of the viahole, the solder bump is not lowered and also the position shifting of the solder bump is not caused (see FIG. 5(b)).

Thus, the invention is made possible to dispose the solder resist layer on the solder bump group without causing the position shifting of the solder bump in the central region other than the solder bumps located from the at least one and up to five rows from an outer position in the solder bump group.

Figure 6:
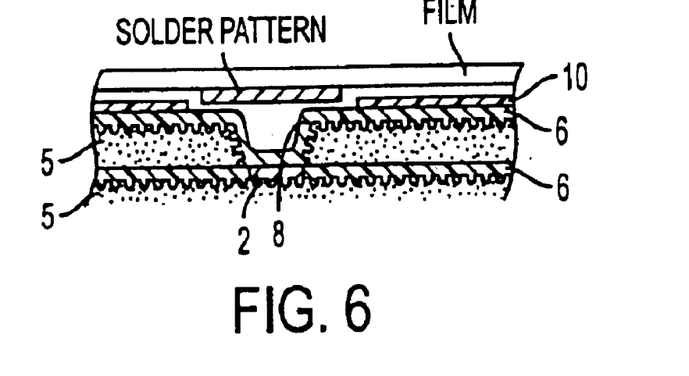
FIG. 6 is a view illustrating fitting of solder pattern into an opening of solder resist in solder transferring process.

The above structure that the opening size of the solder resist is made larger than the pad diameter is particularly advantageous when the solder bump is formed by solder transferring method. The solder transferring method is a method wherein a solder foil attached onto a film is etched so as to form a pattern of the solder foil in place corresponding to positions of pads and placed on the pads so as to contact with them and reflowed by heating to transfer solder to the pads because the solder is poor in the wettability with the film but good in the wettability with the metal. In such a solder transferring method, the area of the solder foil pattern formed on the film becomes generally larger than the pad. Therefore, when the opening size of the solder resist is made larger than the pad diameter, the solder pattern is just inserted into the opening portion of the solder resist and the positioning therebetween becomes easy (see FIG. 6).

In the multilayer printed circuit board according to the invention, the wiring layer located at the outermost surface is formed by flat pads and viaholes between plating resists through the plating resist and further the solder resist layer provided with an opening exposing the flat pad and the viahole is formed on the surface. It is advantageous that a part of the pad, viahole and plating resist is exposed from the opening portion of the solder resist layer by making the opening size of the solder resist layer larger than the diameter of the pad and viahole.

Figure 7A:
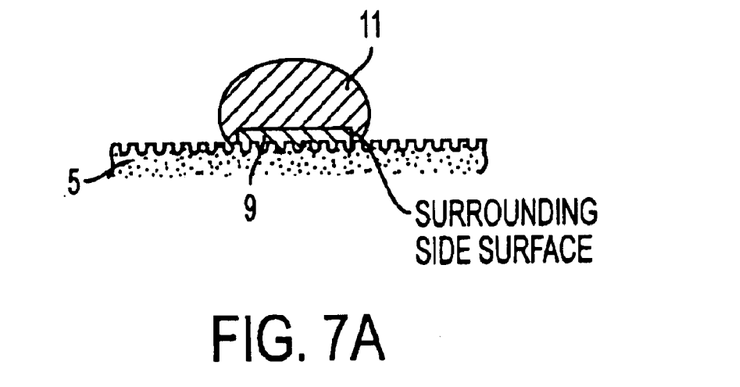
FIG. 7 is a view illustrating difference of forming state of solder bump between (a) no plating resist and (b) plating resist.
Figure 7B:
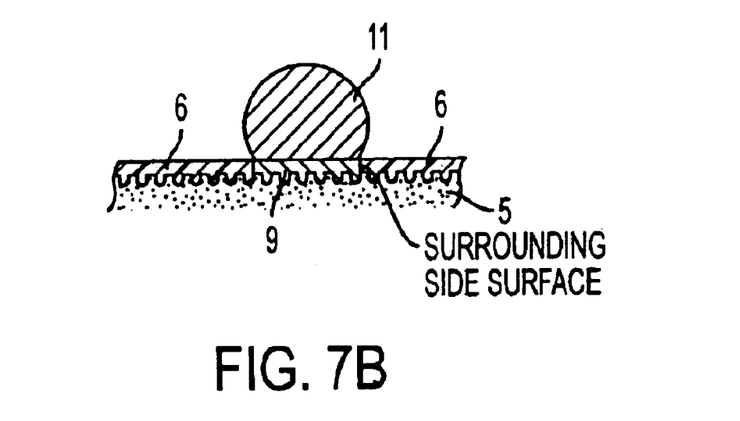

According to the above structure, the surrounding side faces of the pad and viahole are covered with the plating resist (see FIG. 7). Therefore, the solder is not adhered to the surrounding side face. As a result, the connection reliability is excellent because the solder bump is not lowered.

Figure 9:
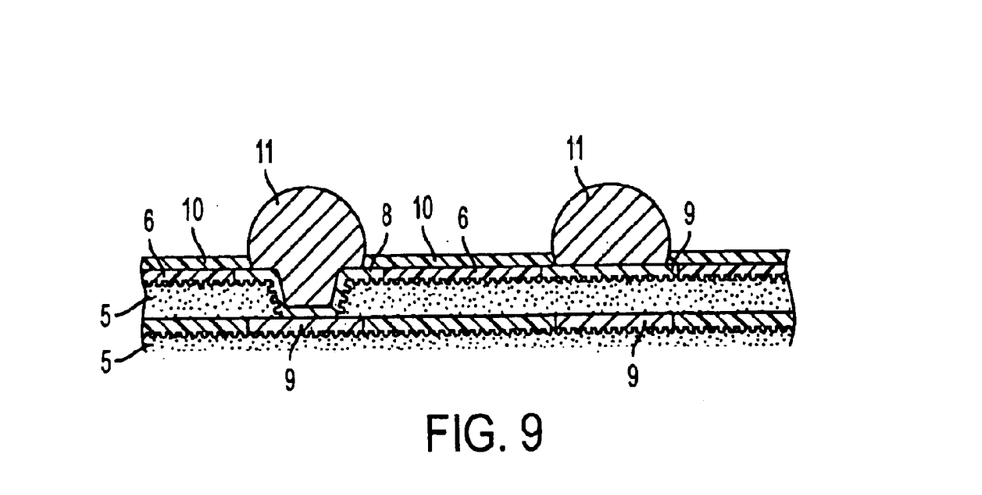
FIG. 9 is a view illustrating solder resist having the opening size which is smaller than the diameter of the pad.

In heat cycle, cracks may be generated in the interlaminar insulating resin layer (the adhesive layer for electroless plating) starting from a boundary between the plating resist and the conductor circuit. In order to prevent the occurrence of cracks, it is desirable that the opening size of the solder resist layer is made smaller than the diameter of the flat pad or the viahole so as to overlap the solder resist with the pad or the viahole as shown in FIG. 9.

The production method of the multilayer printed circuit board according to the invention will be described below.
(1). At first, innerlayer copper patterns 2 are formed on a surface of a substrate (core) 1.

The formation of the copper pattern 2 on the substrate 1 is carried out by a method of etching a copper-clad laminate or a method wherein an adhesive layer for electroless plating is formed on a substrate such as glass epoxy substrate, polyimide substrate, ceramic substrate, metal substrate or the like and the surface of the adhesive layer is roughened to form a roughened surface and then subjected to an electroless plating.

Particularly, when the copper-clad laminate is etched to form the copper patterns 2, it is desirable that a solvent-free resin 3 (epoxy resin or polyimide resin) is applied and cured and polished to expose the copper patterns 2, whereby the substrate surface is smoothened. Since the substrate surface is smoothened, when the photosensitive insulating resin layer is formed thereon, the thickness becomes uniform, so that the exposure and development thereof are easy.

Moreover, through-holes 4 are formed in the core substrate 1, so that the wiring layers located on front and rear surfaces are electrically connected to each other through the through-holes 4.

(2). Then, an interlaminar insulating layer 5 is formed on the innerlayer copper patterns 1 formed in the item (1). The interlaminar insulating layer 5 is desirable to be made from a thermosetting resin such as epoxy resin, polyimide resin, bismaleimide triazine resin, phenolic resin or the like, a photosensitive resin obtained by photosensitization of the thermosetting resin, a thermoplastic resin such as polyether sulphone or the like, a composite of thermoplastic resin and thermosetting resin, or a composite of thermoplastic resin and photosensitive resin.

The surface of the resin layer may be subjected to a roughening treatment with an oxidizing agent, an acid, an alkali or the like. The adhesion property of conductor circuit formed on the surface can be improved by such a roughening.

Particularly, it is desirable that an adhesive for electroless plating may be used as the interlaminar insulating material. As the adhesive for electroless plating, a product obtained by dispersing heat-resistant resin particles soluble in acid or oxidizing agent into a heat-resistant resin hardly soluble in acid or oxidizing agent is optimum. This is due to the fact that pot-like anchor can be formed on the surface by removing the heat-resistant resin particles soluble in acid or oxidizing agent through roughening to improve the adhesion property to the conductor circuit.

In the above adhesive, the photosensitized thermosetting resin and the composite of the photosensitized thermosetting resin and the thermoplastic resin are desirable as the heat-resistant resin hardly soluble in the acid or oxidizing agent because the viahole can easily be formed by the light exposure and development owing to the photosensitization. Further, the toughness can be improved by combining the photosensitized thermosetting resin with the thermoplastic resin, whereby the peel strength of the conductor circuit can be improved and the occurrence of cracks in the viahole portion through heat cycle can be prevented.

Concretely, epoxy acrylate obtained by reacting epoxy resin with acrylic acid, methacrylic acid or the like and the composite of epoxy acrylate and polyether sulphone are favorable. As the epoxy acrylate, it is desirable to react 20–80% of all epoxy group with acrylic acid, methacrylic acid or the like.

In the adhesive, the heat-resistant resin particles is desirable to be selected from ① heat-resistant resin powder having an average particle size of not more than 10 $\mu$m, ② aggregated particles having an average particle size of 2–10 $\mu$m by aggregating heat-resistant resin powder having an average particle size of not more than 2 $\mu$m, ③ a mixture of heat-resistant resin powder having an average particle size of 2–10 $\mu$m and heat-resistant resin powder having an average particle size of not more than 2 $\mu$m, and ④ false particles formed by adhering at least one of heat-resistant resin powder and inorganic powder having an average particle size of not more than 2 $\mu$m onto surfaces of heat-resistant resin powder having an average particle size of 2–10 $\mu$m because they can form complicated anchor. As the heat-resistant resin, epoxy resin, amino resin (melamine resin, urea resin, guanamine resin) and the like are favorable. Particularly, the solubility of the epoxy resin to arbitrary acid or oxidizing agent can be changed by varying the kind of oligomer, kind of curing agent and crosslinking density. For example, when bisphenol A-type epoxy resin oligomer is cured with an amine curing agent, the resulting product is easily dissolved in the oxidizing agent. However, the product obtained by curing novolac epoxy resin oligomer with an imidazole curing agent is hardly dissolved in the oxidizing agent.

As the acid usable in the invention, there are phosphoric acid, hydrochloric acid, sulfuric acid, formic acid or organic acid such as acetic acid or the like. Among them, the organic acid is desirable because it hardly corrodes the metal conductor layer exposed from the viahole after the roughening treatment. As the oxidizing agent, chromic acid, permanganate (potassium permanganate and the like) are ddesirable. Particularly, when the amino resin is dissolved and removed, it is desirable to alternately conduct the roughening treatment with the acid and the oxidizing agent.

In the multilayer printed circuit board according to the invention, the interlaminar insulating layer 5 may be plural. For example, there are the following forms of the plural layers.

① Interlaminar insulating layer of two-layer structure formed between the upperlayer conductor circuit and the lowerlayer conductor circuit, in which an adhesive for electroless plating formed by dispersing heat-resistant resin particles soluble in acid or oxidizing agent into heat-resistant resin hardly soluble in acid or oxidizing agent is located at a side near to the upperlayer conductor circuit and a heat-resistant resin hardly soluble in acid or oxidizing agent is located at a side near to the lowerlayer conductor circuit.

In this structure, there is caused no shortcircuit between layers even when the adhesive layer for electroless plating is subjected to a roughening treatment.

② Interlaminar insulating layer of three-layer structure formed between the upperlayer conductor circuit and lowerlayer conductor circuit, in which a filling resin material is filled between the lowerlayer conductor circuits so as to render the surfaces of the lower conductor circuit and the filling resin material into the same plane and a layer of a heat-resistant resin hardly soluble in acid or oxidizing agent formed thereon and further an adhesive for electroless plating formed by dispersing heat-resistant resin particles soluble in acid or oxidizing agent into heat-resistant resin hardly soluble in acid or oxidizing agent is formed thereon.

In this structure, the filling resin material is filled between the lowerlayer conductor circuits to smoothen the substrate surface, so that there is caused no development inferior based on the scattering of the thickness. Further, when inorganic particles such as silica or the like are incorporated in the filling resin material, the curing shrinkage can be decreased to prevent the warping of the substrate. Moreover, solvent-free resin is desirable as the filling resin material, and particularly solvent-free epoxy resin is optimum. Because, when the solvent is used, it is evaporated by heating to cause the interlaminar peeling.

(3) After the interlaminar insulating layer 5 formed in the item (2) is dried, an opening portion for viahole is formed by light exposure and development in case of the photosensitive resin, or by thermosetting and laser working in case of the thermosetting resin.

(4) After the surface of the interlaminar insulating layer 5 provided with the opening portion for viahole in the item (3) is roughened, a catalyst nucleus is applied thereto.

As the catalyst nucleus, noble metal ion, colloid and the like are desirable. In general, palladium chloride and palladium colloid are used. Moreover, it is desirable to conduct the heating treatment for fixing the catalyst nucleus.

(5) After the catalyst nucleus is applied in the item (4), a plating resist 6 is formed.

As the plating resist 6, use may be made of commercially available products, but a composition of an imidazole curing agent and epoxy acrylate formed by reacting epoxy resin with acrylic acid, methacrylic acid or the like, or a composition of epoxy acrylate, polyether sulphone and imidazole curing agent may be used.

In this case, the ratio of epoxy acrylate to polyether sulphone is desirable to be about 50/50–80/20. If the ratio of epoxy acrylate is too large, the flexibility lowers, while if it is too small, the photosensitivity, resistance to base, resistance to acid, resistance to oxidizing agent lower.

As the epoxy acrylate, it is desirable to react 20–80% of all epoxy groups with acrylic acid, methacrylic acid or the like. If the acrylation ratio is too high, the hydrophilicity through OH group becomes high and the hygroscopicity rises, while when it is too low, the resolution lowers.

As a basic skeleton resin, the epoxy resin is desirable to be novolac type epoxy resin because it is high in the crosslinking density and excellent in the resistance to base and can adjust the water absorption of the cured product to not more than 10%. As the novolac type epoxy resin, there are cresol novolac type epoxy resin and phenol novolac type epoxy resin.

(6) A portion not forming the plating resist 6 through the treatment of the item (5) is subjected to a primary plating. In this case, not only copper pattern 7 but also viaholes 8 are formed.

As the primary plating, an alloy plating using at least two metal ions selected from copper, nickel, cobalt and phosphorus is desirable because this alloy is high in the strength and can improve the peel strength.

In the primary electroless plating solution, it is desirable to use hydroxy carboxylic acid as a complexing agent forming a stable complex with copper, nickel, cobalt ion under a basic condition.

In the primary electroless plating solution, a reducing agent for reducing a metal ion to a metallic element is desirable to be at least one substance selected from aldehyde, hypophosphate (called as aphosphinate), hydroboride and hydrazine. These reducing agents are soluble in water and excellent in the reducing force. Particularly, the hypophosphate is desirable in a point of precipitating nickel.

As a pH adjusting agent for adjusting the basic condition in the primary electroless plating solution, it is desirable to use at least one basic compound selected from sodium hydroxide, potassium hydroxide and calcium hydroxide. A hydroxy carboxylic acid forms a complex with nickel ion or the like under the basic condition. As the hydroxy carboxylic acid, citric acid, malic acid, tartaric acid and the like are desirable. The concentration of hydroxy carboxylic acid is desirable to be 0.1–0.8M. When it is less than 0.1M, the sufficient complex can not be formed and the abnormal precipitation and liquid decomposition are caused. While, when it exceeds 0.8M, the precipitation rate becomes slow and the occurrence of hydrogen is large.

The primary electroless plating solution is desirable to contain bipyridyl because bipyridyl can control the occurrence of metal oxide in the plating bath to control the occurrence of nojule.

Moreover, copper ion, nickel ion and cobalt ion are supplied by dissolving compounds of copper, nickel and cobalt such as copper sulfate, nickel sulfate, cobalt sulfate, copper chloride, nickel chloride, cobalt chloride and the like.

The primary plated film formed from the electroless plating solution is excellent in the followability to the roughened surface of the adhesive layer for electroless plating and traces the form of the roughened surface. Therefore, the primary plated film has the same anchors as the roughened surface. Therefore, a secondary plated film formed on the primary plated film ensures the adhesion property owing to the anchors. For this end, the primary plated film is desirable to be a high strength plated film precipitated from the aforementioned electroless plating solution for controlling the peel strength, while the secondary plated film is desirable to be high in the electrical conductivity and fast in the precipitation rate and is preferably a plated film precipitated from a simple copper plating solution instead of the composite plating solution.

(7) A secondary plating is applied onto the primary plated film formed in the item (6) to form conductor circuits inclusive of viaholes. The plated film through the secondary plating is desirable to be a copper plated film.

As the secondary electroless plating solution, it is desirable to use an electroless plating solution comprising copper ion, trialkanol amine, reducing agent and pH adjusting agent, in which the concentration of copper ion is 0.005–0.015 mol/l, and the concentration of the pH adjusting agent is 0.25–0.35 mol/l, and the concentration of the reducing agent is 0.01–0.04 mol/l. This plating solution is stable in the bath and less in the occurrence of nojule.

In the secondary electroless plating solution, the concentration of trialkanol amine is desirable to be 0.1–0.8M. The plating precipitation reaction most proceeds within this range. The trialkanol amine is desirable to be at least one of triethanol amine, triispanol ammine, trimethanol amine and tripropanol amine because they are soluble in water.

In the secondary electroless plating solution, the reducing agent is desirable to be at least one of aldehyde, hypophosphate, hydroborate and hydrazine because they are soluble in water and have a reducing force under the basic condition. The pH adjusting agent is desirable to be at least one of sodium hydroxide, potassium hydroxide and calcium hydroxide.

Figure 8:
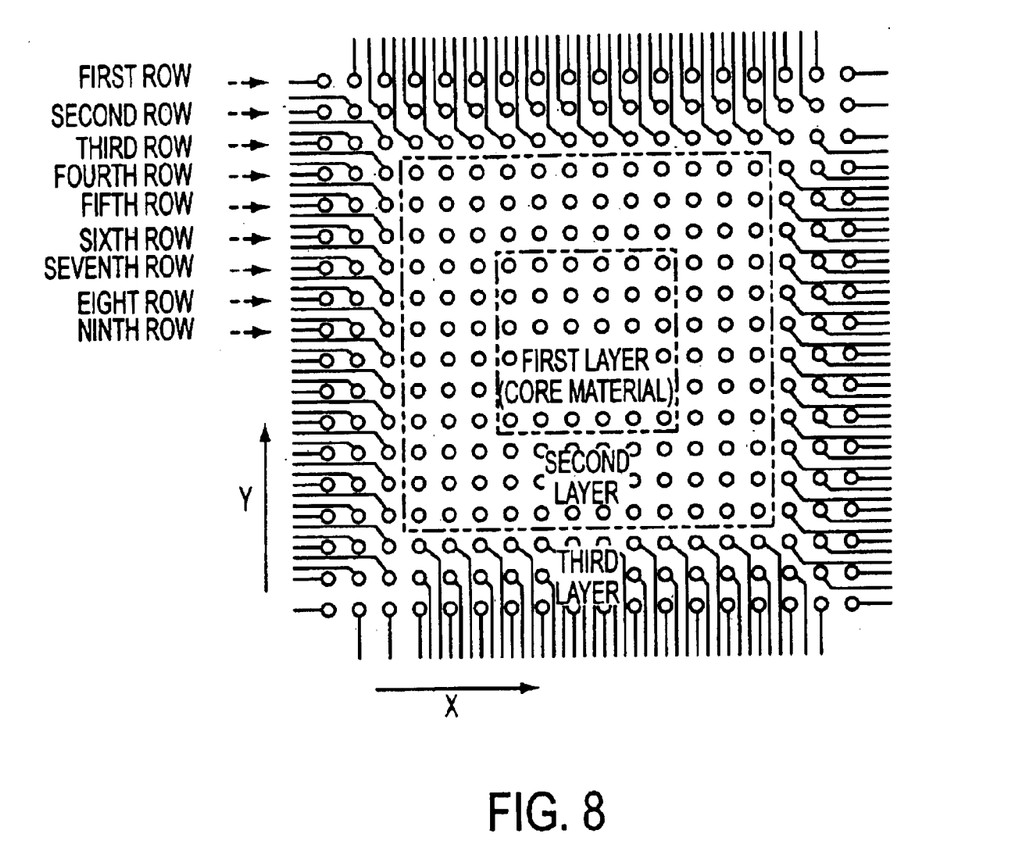
FIG. 8 is a view illustrating the connection of a solder bump to respective conductor pattern in which layer.

In this way, there are formed conductor patterns comprised of the primary plated film and the secondary plated film, innerlayer pad group connected through the upperlayer and viaholes (32 pads in total from third and fourth rows in FIG. 1, 108 pads in total in FIGS. 2 and 8) and viahole group for connecting to conductor patterns on the core substrate (four viaholes in center of fifth row in FIG. 1, 38 viaholes in total in FIGS. 2 and 8).

(8) Thereafter, the steps (2) and (3) are repeated to form an interlaminar insulating layer 5 having opening portion for viahole (36 openings in total of rows other than first and second rows in FIG. 1, 144 viaholes in total in FIGS. 2 and 8) for forming solder pad group on the upperlayer).

(9) After the surface of the interlaminar insulating layer is roughened and a catalyst nucleus is applied thereto, a plating resist composition is applied, dried, exposed and developed to from a plating resist 6 having opening portions for the formation of pad and viahole (100 openings in total in FIG. 1, 324 openings in total in FIGS. 2 and 8) at positions for the supply of solder bump 11.

(10) Then, the steps (6), (7) are repeated, whereby a portion not forming the plating resist 6 is subjected to the primary plating and the secondary plating to form flat pads 9 at the first and second rows (64 pads in total) and viaholes 8 at the inside thereof (36 viaholes in total) in case of FIG. 1, or flat pads 9 at the first, second and third rows (180 pads in total) and viaholes at the inside thereof (36 viaholes in total) in case of FIGS. 2 and 8.

(11) Then, the surfaces of the pads 9 and the viaholes 8 formed in the item (10) are subjected to Ni plating and Au plating in this order.

(12) Further, a photosensitive solder resist 10 is applied, exposed to light and developed to form a layer 10 of the solder resist provided with openings having a size larger than the pad 9 and viahole 8 at positions corresponding to these pads and viaholes. Concretely, the size of the viahole 8 is 175 $\mu$m, and the size of pad 9 is 100 $\mu$m, and the opening size of the solder resist 10 in the viahole portion 8 is 200 $\mu$m, and the opening size of the solder resist 10 in the pad portion 9 is 125 $\mu$m.

(13) A solder foil is laminated on a polyethylene terephthalate film, which is etched so as to leave solder patterns at positions corresponding to the viaholes and the pads. Then, the film is laminated so as to contact the solder patterns with the pads and the viaholes and the solder is transferred onto the pads and the viaholes by reflowing under heating to form solder bumps. Moreover, the ratio of solder amount in the pad portion to solder amount in the viahole portion is, for example, 190:210.

A diagrammatically section view of the thus obtained multilayer printed circuit board is shown in FIG. 1. The illustrated multilayer printed circuit board is provided on its rear surface side with multilayer wiring layers, which is fundamentally produced in the same manner as described above.

"In the invention, a semi-additive process may be adopted in addition to the above full additive process as the method of producing the multilayer printed circuit board.

The semi-additive process is a method wherein a surface of an interlaminar insulating resin layer is roughened and subjected to an electroless plating of a thin thickness over a full surface and a plating resist is formed on a portion of the electroless plated film not forming conductor and a portion not forming the resist is subjected to an electrolytic plating of a thick thickness and then the plating resist and the electroless plated film located therebelow are removed to form a conductor circuit pattern."

The multilayer printed circuit board develops the following effects.

①. As seen from FIG. 1, the solder bumps are gradually divided from the outside into stepwise underlayer conductor circuits and connected to external terminals located at the rear surface side through each of the conductor circuits. Therefore, the solder bumps are not required to be connected to the external terminals through wirings drawn out from the pads, and also the distance between the solder pads is sufficient to have an approximately width capable of passing one wiring. As a result, the high integration of chips (high densification) can be realized. Furthermore, the wiring length can be shortened, so that the transmitting delay becomes small and a signal of high frequency can be transmitted.

②. Since the group of metallic viaholes are formed in the interlaminar insulating layer, there is cause no warping or distortion of the interlaminar insulating layer accompanied with the curing shrinkage or thermal expansion of the resin. Furthermore, the flat pads surround the outer periphery of the viahole group so as to serve as a buffering zone, which can control the occurrence of cracks surrounding the viahole group forming zone (it is guessed by the difference of thermal expansion coefficient between the viahole group forming zone and the insulating resin layer).

③. In case of attaining the high densification of the solder bumps, it is necessary that the opening size of the solder resist is made larger than the size of the pad or viahole considering the position displacement of the photomask. In this point, according to the invention, even if the opening size is made large, a greater part of the solder pad group is matched with the viaholes, so that there is caused no exposure of the conductor pattern resulting in the position displacement or height lowering of the solder bump.

As mentioned above, according to the invention, there can be provided a multilayer printed circuit board for the mounting of flip chips capable of attaining the high densification of the solder bumps and being less in the distortion accompanied with the curing shrinkage of the resin and the position displacement of the solder and having an excellent mounting reliability.

Furthermore, the multilayer printed circuit board according to the invention can control the occurrence of cracks in heat cycle (can prevent wiring breakage) and is excellent in the durability.

Moreover, the multilayer printed circuit board according to the invention can shorten the wiring length and is less in the transmission delay and low in the noise and can be used at a high frequency zone.

What is claimed is:

1. A multilayer printed circuit board, comprising:

a core substrate;

multilayer wiring layers formed on the core substrate by alternately laminating interlaminar insulating layer and conductor pattern;

a group of solder pads having solder bumps planarly arranged on an outermost surface of the multilayer wiring layers, the group of solder pads including an outer layer pad group and an inner layer pad group;

wherein the outer layer pad group includes solder pads located in at least two and up to five rows from an outer position of the solder pad group having flat pads each connected to an outermost conductor pattern located on the outermost surface and having solder bumps formed on surfaces of the solder pads;

wherein solder pads other than the solder pads connected to the conductor pattern on the outermost surface form the inner layer pad group; and wherein the inner layer pad group comprises solder pads which are connected to viaholes connected to flat inner layer pads located on one of a first inner layer and at least one further inner layer with solder bumps beings formed in recess portions of the viaholes, the inner layer pad group comprising solder pads located in at least one and up to five rows from an outer position of the inner layer pad group that are connected through the viaholes to flat pads connected to conductor patterns on the first inner layer, while solder pads of the inner layer pad group other than the solder pads connected to flat pads connected to conductor patterns on the first inner layer are connected through the viaholes to flat pads located on the at least one further inner layer located inward relative to the first inner layer.

2. The multilayer printed circuit board of claim 1, wherein the interlaminar insulating layer comprises a roughened surface having a surface roughness of 5 to 15 $\mu$m.

3. The multilayer printed circuit board of claim 2, wherein the inner layer pad group comprising solder pads located in at least one and up to five rows from an outer position of the inner layer pad group comprises a plurality of rows from an outer position.

4. The multi layer printed circuit board of claim 2, wherein the inner layer pad group comprises solder pads which are connected to viaholes connected to flat inner layer pads located on at least one further inner layer.

5. The multilayer printed circuit board of claim 4, wherein the solder pads which are connected to viaholes connected to flat inner layer pads located oil at least one further inner layer comprise a plurality of rows of solder pads.

6. The multilayer printed circuit board of claim 2, wherein the solder pads are arranged zigzag in an X-Y direction on the outermost surface of the multilayer wiring layer.

7. The multilayer printed circuit board of claim 1, wherein an outermost surface of the multilayer printed circuit board comprises a solder resist layer, and wherein an opening of the solder resist is larger than a diameter of a corresponding flat pad and viahole of a solder pad so as to not overlap the solder resist on the corresponding flat pad and viahole.

8. The multilayer printed circuit board of claim 7, wherein the inner layer pad group comprising solder pads located in at least one and Up to five rows from an outer position of the inner layer pad group comprises a plurality of rows from an outer position.

9. The multilayer printed circuit board of claim 7, wherein the inner layer pad group comprises solder pads which are connected to viaholes connected to hat inner layer pads located on at least one further inner layer.

10. The multilayer printed circuit board of claim 9, wherein the solder pads which are connected to viaholes connected to flat inner layer pads located on at least one further inner layer comprise a plurality of rows of solder pads.

11. The multilayer printed circuit board of claim 7, wherein the solder pads are arranged zigzag, in an X-Y direction on the outermost surface of the multilayer wiring layer.

12. The multilayer printed circuit board of claim 1, wherein an outermost surface of the multilayer printed circuit board comprises a solder resist layer, and wherein an opening of the solder resist is smaller than a diameter of a corresponding flat pad and viahole of a solder pad so as to overlap the solder resist on the corresponding flat pad and viahole.

13. The multilayer printed circuit board of claim 12, herein the inner layer pad group comprising solder pads located in at least one and up to five rows from an outer position of the inner layer pad group comprises a plurality of rows from an outer position.

14. The multilayer printed circuit board of claim 12, wherein the inner layer pad group comprises solder pads which are connected to viaholes connected to flat inner layer pads located on at least one further inner layer.

15. The multilayer printed circuit board of claim 14, wherein the solder pads which are connected to viaholes connected to flat inner layer pads located on at least one further inner layer comprise a plurality of rows of solder pads.

16. The multilayer printed circuit board of claim 12, wherein the solder pads are arranged zigzag in an X-Y direction on the outermost surface of the multilayer wiring layer.

17. The multilayer printed circuit board of claim 1, wherein the inner layer pad group comprising solder pads located in at least one and up to five rows from an outer position of the inner layer pad group comprises a plurality of rows from an outer position.

18. The multilayer printed circuit board of claim 1, wherein the inner layer pad group comprises solder pads which are connected to viaholes connected to flat inner layer pads located on at least one further inner layer.

19. The multilayer printed circuit board of claim 18, wherein the solder pads which are connected to viaholes connected to flat inner layer pads located on at least one further inner layer comprise a plurality of rows of solder pads.

20. The multilayer printed circuit board of claim 1, wherein the solder pads are arranged zigzag in an X-Y direction on the outermost surface of the multilayer wiring layer.

* * * * *

UNITED STATES PATENT AND TRADEMARK OFFICE
CERTIFICATE OF CORRECTION

PATENT NO. : 6,831,234 B1
DATED : December 14, 2004
INVENTOR(S) : M. Asai et al.

It is certified that error appears in the above-identified patent and that said Letters Patent is hereby corrected as shown below:

Column 12,
Line 44, "beings" should be -- being --.

Column 13,
Line 3, "oil" should be -- on --.
Line 16, "Up" should be -- up --.
Line 21, "hat" should be -- flat --.

Column 14,
Line 2, "herein" should be -- wherein --.

Signed and Sealed this

Sixth Day of September, 2005

JON W. DUDAS
*Director of the United States Patent and Trademark Office*